(12) United States Patent
Lin et al.

(10) Patent No.: US 8,704,341 B2
(45) Date of Patent: Apr. 22, 2014

(54) SEMICONDUCTOR PACKAGES WITH THERMAL DISSIPATION STRUCTURES AND EMI SHIELDING

(75) Inventors: I-Chia Lin, Tainan (TW); Yu-Chou Tseng, Chiayi (TW); Jin-Feng Yang, Kaohsiung (TW); Chi-Sheng Chung, Kaohsiung (TW); Kuo-Hsien Liao, Taichung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 96 days.

(21) Appl. No.: 13/472,131

(22) Filed: May 15, 2012

(65) Prior Publication Data

US 2013/0307128 A1 Nov. 21, 2013

(51) Int. Cl.
*H01L 23/552* (2006.01)

(52) U.S. Cl.
CPC .................................... *H01L 23/552* (2013.01)
USPC ........................................................ 257/659

(58) Field of Classification Search
CPC .................................................. H01L 23/552
USPC .................................. 257/660–665, E29.282
See application file for complete search history.

(56) References Cited

U.S. PATENT DOCUMENTS

| | | |
|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie, Jr. |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai et al. |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |

(Continued)

FOREIGN PATENT DOCUMENTS

| | | |
|---|---|---|
| CN | 1442033 | 9/2003 |
| CN | 1774804 | 5/2006 |

(Continued)

*Primary Examiner* — Brook Kebede

(74) *Attorney, Agent, or Firm* — Klein, O'Neill & Singh, LLP

(57) ABSTRACT

Semiconductor packages and related methods. The semiconductor package includes a substrate, a semiconductor chip, a package body, a recess and a conductive layer. The substrate includes a grounding element. The semiconductor chip is disposed on the substrate and has a lateral surface and an upper surface. The package body encapsulates the lateral surface of the semiconductor chip. The recess is formed in the package body and exposes the upper surface of the semiconductor chip. The conductive layer covers an outer surface of the package body, the grounding element and the upper surface of the semiconductor chip exposed by the recess to provide both thermal dissipation and EMI shielding for the semiconductor chip.

19 Claims, 17 Drawing Sheets

(56) References Cited

U.S. PATENT DOCUMENTS

| | | |
|---|---|---|
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,960 A | 7/2000 | Tao et al. |
| 6,093,972 A | 7/2000 | Carney et al. |
| 6,150,193 A | 11/2000 | Glenn |
| 6,191,360 B1 | 2/2001 | Tao et al. |
| 6,194,250 B1 | 2/2001 | Melton et al. |
| 6,225,694 B1 | 5/2001 | Terui |
| 6,229,702 B1 | 5/2001 | Tao et al. |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,429,512 B1 | 8/2002 | Huang et al. |
| 6,444,498 B1 | 9/2002 | Huang et al. |
| 6,448,632 B1 | 9/2002 | Takiar et al. |
| 6,455,864 B1 | 9/2002 | Featherby et al. |
| 6,458,626 B1 | 10/2002 | Huang et al. |
| 6,472,598 B1 | 10/2002 | Glenn |
| 6,472,743 B2 | 10/2002 | Huang et al. |
| 6,479,903 B2 | 11/2002 | Briar |
| 6,483,187 B1 | 11/2002 | Chao et al. |
| 6,492,194 B1 | 12/2002 | Bureau et al. |
| 6,521,978 B2 | 2/2003 | Fenk et al. |
| 6,528,882 B2 | 3/2003 | Ding et al. |
| 6,541,310 B1 | 4/2003 | Lo et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,800,804 B2 | 10/2004 | Igarashi et al. |
| 6,801,429 B2 | 10/2004 | Tsai et al. |
| 6,828,687 B2 | 12/2004 | Ding |
| 6,838,776 B2 | 1/2005 | Leal et al. |
| 6,844,622 B2 | 1/2005 | Huang et al. |
| 6,856,007 B2 | 2/2005 | Warner |
| 6,865,084 B2 | 3/2005 | Lin et al. |
| 6,881,896 B2 | 4/2005 | Ebihara |
| 6,900,383 B2 | 5/2005 | Babb et al. |
| 6,918,178 B2 | 7/2005 | Chao et al. |
| 6,928,719 B2 | 8/2005 | Kim et al. |
| 6,933,993 B2 | 8/2005 | Peng et al. |
| 6,936,930 B2 | 8/2005 | Wang |
| 6,946,729 B2 | 9/2005 | Lee et al. |
| 6,949,413 B2 | 9/2005 | Lo et al. |
| 6,949,414 B2 | 9/2005 | Lo et al. |
| 6,951,776 B2 | 10/2005 | Lo et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,002,246 B2 | 2/2006 | Ho et al. |
| 7,002,805 B2 | 2/2006 | Lee et al. |
| 7,005,749 B2 | 2/2006 | Hsu et al. |
| 7,015,577 B2 | 3/2006 | Wang |
| 7,025,848 B2 | 4/2006 | Wang |
| 7,026,719 B2 | 4/2006 | Wang |
| 7,030,469 B2 | 4/2006 | Mahadevan et al. |
| 7,034,388 B2 | 4/2006 | Yang et al. |
| 7,037,750 B2 | 5/2006 | Tsai et al. |
| 7,045,385 B2 | 5/2006 | Kim et al. |
| 7,045,395 B2 | 5/2006 | Lo et al. |
| 7,049,682 B1 | 5/2006 | Mathews et al. |
| 7,061,079 B2 | 6/2006 | Weng et al. |
| 7,071,553 B2 | 7/2006 | Tsai et al. |
| 7,074,645 B2 | 7/2006 | Huang et al. |
| 7,081,661 B2 | 7/2006 | Takehara et al. |
| 7,122,911 B2 | 10/2006 | Yang |
| 7,125,744 B2 | 10/2006 | Takehara et al. |
| 7,161,252 B2 | 1/2007 | Tsuneoka et al. |
| 7,163,840 B2 | 1/2007 | Chen et al. |
| 7,164,210 B2 | 1/2007 | Tsai et al. |
| 7,180,012 B2 | 2/2007 | Tsuneoka et al. |
| 7,183,498 B2 | 2/2007 | Ogura et al. |
| 7,186,928 B2 | 3/2007 | Kikuchi et al. |
| 7,187,060 B2 | 3/2007 | Usui |
| 7,224,057 B2 | 5/2007 | Yang |
| 7,250,676 B2 | 7/2007 | Wang |
| 7,256,494 B2 | 8/2007 | Huang et al. |
| 7,259,445 B2 | 8/2007 | Lau et al. |
| 7,259,456 B2 | 8/2007 | Wang |
| 7,294,587 B2 | 11/2007 | Asahi et al. |
| 7,327,015 B2 | 2/2008 | Yang et al. |
| 7,335,982 B2 | 2/2008 | Kao et al. |
| 7,342,303 B1 | 3/2008 | Berry et al. |
| 7,365,422 B2 | 4/2008 | Liu et al. |
| 7,372,151 B1 | 5/2008 | Fan et al. |
| 7,411,790 B2 | 8/2008 | Huang |
| 7,445,968 B2 | 11/2008 | Harrison et al. |
| 7,446,265 B2 | 11/2008 | Krohto et al. |
| 7,446,409 B2 | 11/2008 | Yang |
| 7,451,539 B2 | 11/2008 | Morris et al. |
| 7,478,474 B2 | 1/2009 | Koga |
| 7,482,204 B2 | 1/2009 | Kao et al. |
| 7,488,903 B2 | 2/2009 | Kawagishi et al. |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,643,311 B2 | 1/2010 | Coffy |
| 7,656,047 B2 | 2/2010 | Yang et al. |
| 7,692,290 B2 | 4/2010 | Chang et al. |
| 7,700,411 B2 | 4/2010 | Yang et al. |
| 7,745,910 B1 | 6/2010 | Olson et al. |
| 7,763,959 B2 | 7/2010 | Liu et al. |
| 7,816,773 B2 | 10/2010 | Liu |
| 7,829,981 B2 | 11/2010 | Hsu |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0205978 A1* | 9/2005 | Pu et al. ..................... 257/678 |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |

(56) References Cited

U.S. PATENT DOCUMENTS

| | | |
|---|---|---|
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2011/0006408 A1 | 1/2011 | Liao |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0127654 A1 | 6/2011 | Weng et al. |
| 2012/0228751 A1* | 9/2012 | Song .............................. 257/660 |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 2078299 | 3/1990 |
| JP | 3023654 | 1/1991 |
| JP | 3171652 | 7/1991 |
| JP | 4147652 | 5/1992 |
| JP | 4206858 | 7/1992 |
| JP | 5129476 | 5/1993 |
| JP | 8288686 | 1/1996 |
| JP | 2003273571 | 9/2003 |
| WO | WO2004060034 | 7/2004 |
| WO | WO2006/076613 | 7/2006 |

* cited by examiner

SEMICONDUCTOR PACKAGES WITH THERMAL DISSIPATION STRUCTURES AND EMI SHIELDING

TECHNICAL FIELD

The present embodiments relate to semiconductor packages and related methods, and more particularly to improvements in thermal dissipation and shielding effectiveness.

BACKGROUND

As operation speed increases and device size decreases, semiconductor packages encounter problems with both electromagnetic shielding and thermal dissipation. Particularly, higher clock speeds cause more frequent transitions between signal levels, and increase the intensity of electromagnetic emissions under high frequency or short wave. Electromagnetic emissions may radiate from one semiconductor element to an adjacent semiconductor element. Electromagnetic interference (EMI) negatively affects the operation of a semiconductor element if electromagnetic emissions of the adjacent semiconductor element have higher intensity. If an electronic system has a high-density distribution of semiconductor elements, then the EMI among the semiconductor elements becomes even worse.

As electronic systems become more densely populated, proper heat dissipation becomes more difficult. Heat can reduce the efficiency of, and even damage, semiconductor packages and other electronic components in the electronic system. Accordingly, a need exists for semiconductor packages that have enhanced thermal dissipation and shielding effectiveness without detrimentally impacting device reliability, safety, cycle time, and/or cost.

SUMMARY

One of the present embodiments comprises a semiconductor package including a substrate having a grounding element and a semiconductor chip disposed on the substrate. The semiconductor chip has a plurality of bond pads. The package further comprises a package body encapsulating the semiconductor chip and a recess in the package body that exposes at least a portion of an upper surface of the semiconductor chip. The package further comprises a conductive connecting element disposed in the recess between at least two of the bond pads. The conductive connecting element extends beyond a lateral edge of the semiconductor chip. The package further comprises a conductive layer disposed over an outer surface of the package body. The conductive layer directly contacts the conductive connecting element and the grounding element. A combination of the conductive element and the conductive layer provides thermal dissipation and electromagnetic interference (EMI) shielding for the semiconductor package.

Another of the present embodiments comprises a semiconductor package including a substrate having a grounding element and a semiconductor chip disposed on the substrate. The semiconductor chip has a plurality of bond pads. The package further comprises a package body encapsulating the semiconductor chip and a recess in the package body that exposes at least a portion of the upper surface of the semiconductor chip. The package further comprises means coupled to the upper surfaces of the semiconductor chip and the package body for providing thermal dissipation and electromagnetic interference (EMI) shielding for the semiconductor package.

Another of the present embodiments comprises a method of making a semiconductor package. The method comprises disposing a semiconductor chip on a substrate. The semiconductor chip has a lateral surface and an upper surface, and the substrate comprises a grounding element. The method further comprises forming a package body encapsulating the lateral surface of the semiconductor chip, wherein the package body defines a recess exposing the upper surface of the semiconductor chip. The method further comprises singulating the package body, the substrate, and the grounding element to expose a sidewall of the grounding element. The method further comprises forming a conductive layer covering an outer surface of the package body and the upper surface of the semiconductor chip exposed by the recess, and contacting the exposed grounding element.

Figure 1A:
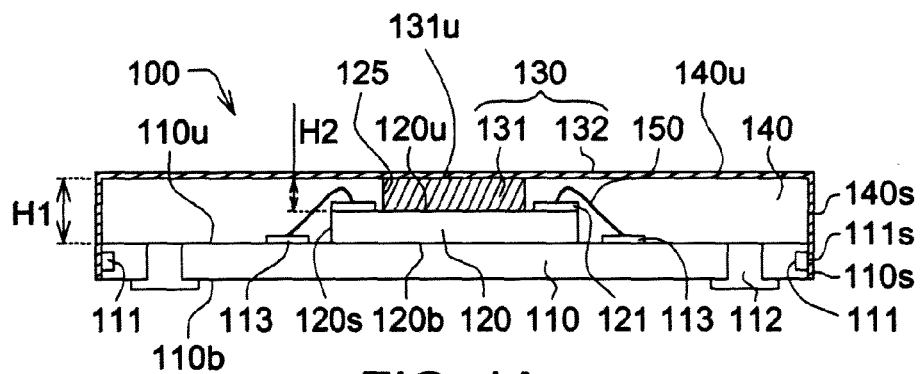
FIG. 1A is a cross-sectional side view of a semiconductor package according to one of the present embodiments.

Common reference numerals are used throughout the drawings and the detailed description to indicate the same elements. The present invention will be more apparent from the following detailed description taken in conjunction with the accompanying drawings.

DETAILED DESCRIPTION

Referring to FIG. 1A, a cross-sectional side view of a semiconductor package 100 according to one of the present embodiments is illustrated. The semiconductor package 100 includes a substrate 110, a chip 120, a recess 125 in a package body 140, a conductive layer 130, and a plurality of bond wires 150.

The substrate 110 includes at least one grounding element 111, at least one through hole 112, and at least one pad 113, and has an upper surface 110u and a lower surface 110b opposite the upper surface 110u. The grounding element 111 is located between, but spaced from, the upper surface 110u and the lower surface 110b of the substrate 110. That is, the grounding element 111 is disposed within the substrate. However, in alternate embodiments the grounding element 111 may extend to either or both of the upper surface 110u and the lower surface 110b of the substrate 110. An outer lateral surface 111s of the grounding element 111 is exposed from an outer lateral surface 110s of the substrate 110. In some embodiments, the grounding element 111 may comprise a ring, which is in a substantially continuous pattern extending along a border of the substrate 110 and exposed at the outer lateral surface 110s of the substrate 110. In some embodiments, the grounding element 111 may comprise a partial via.

As illustrated in FIG. 1A, the outer lateral surface 110s of the substrate 110, the outer lateral surface 140s of the package body 140, and the outer lateral surface 111s of the grounding element 111 are substantially coplanar with each other. However, in other embodiments not all of these surfaces need be coplanar.

The through hole 112 extends between the lower surface 110b and the upper surface 110u of the substrate 110. The pads 113 are formed on the upper surface 110u of the substrate 110. At least two of the grounding elements 111, the through holes 112, and the pads 113 may be electrically connected through a trace layer (not shown) formed on the upper surface 110u of the substrate 110 or formed in the substrate 110 through a wire layer (not shown). In addition, one of the through holes 112 may be electrically connected to an external ground voltage, so that the grounding element 111 may be electrically connected to the external ground voltage.

The semiconductor chip 120 is disposed on the substrate 110 in a face-up manner, and has a lateral surface 120s, an upper surface 120u, and at least one pad 121. In the illustrated embodiment, the upper surface 120u is an active surface of the chip 120, and the pads 121 are formed on the upper surface 120u. The bond wires 150 connect the pads 121 of the chip 120 to the pads 113 of the substrate 110. In alternative embodiments, the chip 120 may be disposed on the substrate 110 in a face-down manner and be electrically connected to the substrate 110 through a plurality of solder balls, e.g. a "flip chip" configuration.

The conductive layer 130 includes a conductive connecting element 131 within the recess 125 above the chip 120 and a conformal shield 132. The recess 125 exposes the upper surface 120u of the chip 120, and the conductive connecting element 131 covers the upper surface 120u of the chip 120. The conductive connecting element 131 may comprise aluminum, copper, chromium, tin, gold, silver, nickel, stainless steel, and/or alloys thereof, or any other material. In addition, the conductive connecting element 131 may comprise a material similar to or the same as that of the conformal shield 132. Preferably, the conductive layer 130 comprises a material with a high coefficient of thermal conductivity and high electrical conductivity.

As illustrated in FIG. 1A, the conductive layer 130 covers the outer surface of the package body 140, the outer lateral surfaces 111s of the grounding element 111, and the upper surface 120u of the chip 120 exposed by the recess 125. By directly contacting the chip 120 with the conductive layer 130, the heat generated by the chip 120 may be efficiently transmitted to the exterior through the conductive layer 130. Further, the conductive layer 130 may be used both as a thermal dissipation element as well as an EMI shielding element.

The conductive connecting element 131 may completely fill the recess 125, as shown. For example, the upper surface 131u of the conductive connecting element 131 is substantially coplanar with the upper surface 140u of the package body 140. The conductive connecting element 131 filling the recess 125 may be used as a buffer layer for alleviating any concentration of stress caused by deformation of the package body 140. In another embodiment, the conductive connecting element 131 may protrude above the upper surface 140u of the package body 140. In another embodiment, the conductive connecting element 131 may fill only a portion of the recess 125.

The conformal shield 132 covers the outer surfaces of the package body 140 (the upper surface 140u and outer lateral surface 140s), the upper surface 131u of the conductive connecting element 131, and the grounding element 111. The conformal shield 132 may comprise any of the materials listed above with respect to the conductive connecting element 131, or any other material. The conformal shield 132 may be a single-layered or multi-layered structure. When the conformal shield 132 is a multi-layered structure, such as a triple-layered structure, the inner layer, the middle layer and the outer layer may be, respectively, a stainless steel layer, a copper layer and a stainless steel layer. In one embodiment, the conformal shield 132 is a double-layered structure, wherein the inner layer is a copper layer, and the outer layer is a stainless steel layer. In addition, the thickness of the conformal shield 132 is preferably, but not restrictively, larger than 50 μm to simultaneously improve thermal dissipation and shielding effectiveness.

The package body 140 encapsulates the lateral surface 120s of the chip 120. The package body 140 may comprise novolac-based resin, epoxy-based resin, silicon-based resin, or any other suitable encapsulant. The package body 140 may also include a suitable filling agent, such as powdered silicon dioxide, for example. In one embodiment, the package body 140 is a molding compound or a pre-preg lamination.

Figure 1B:
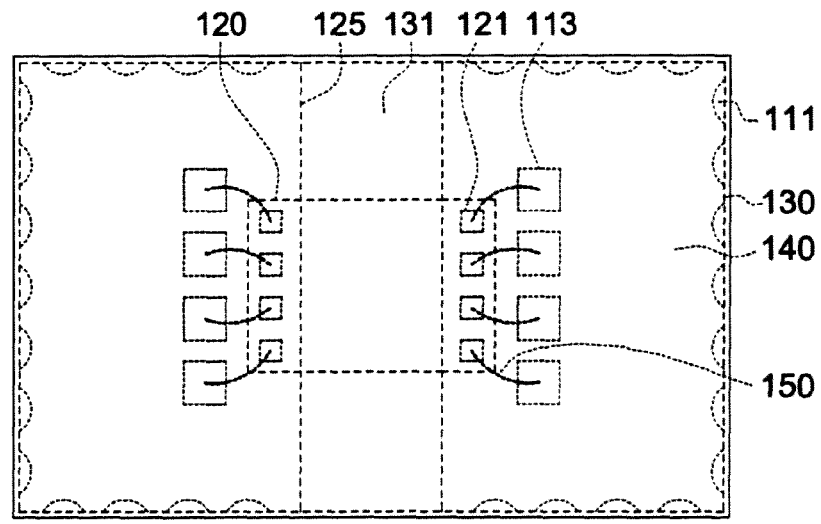
FIG. 1B is a top plan view of the semiconductor package of FIG. 1A.
Figure 2:
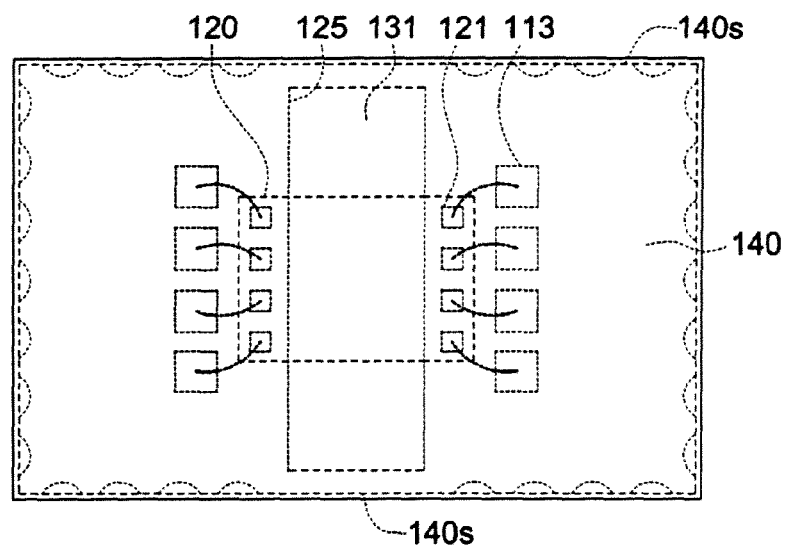
FIG. 2 is a top plan view of a semiconductor package according to another of the present embodiments.

Referring to FIG. 1B, a top plan view of FIG. 1A is illustrated. The semiconductor chip 120 is surrounded by a plurality of grounding elements 111. In the present embodiment, the recess 125 and the conductive connecting element 131 extend completely across the package body 140. Further, the conductive connecting element 131 does not contact any of the pads 113 or the bond wires 150 so as to prevent short circuiting. However, in alternative embodiments the recess 125 and the conductive connecting element 131 may extend only partially across the package body 140. For example, referring to FIG. 2, a top plan view of a semiconductor package according to another of the present embodiments is illustrated. In this embodiment, the recess 125 and the conductive connecting element 131 extend between, but not all the way to, opposite outer lateral surfaces 140s of the package body 140.

Figure 3:
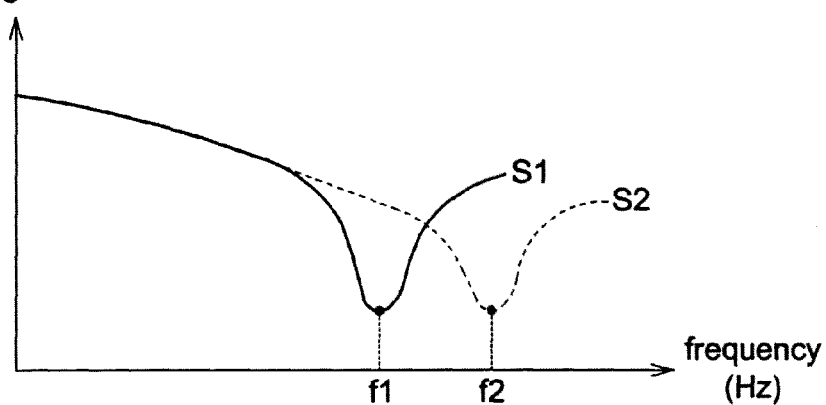
FIG. 3 is a graph illustrating shielding effect versus frequency for the conductive layer of the semiconductor package of FIG. 1A.

FIG. 3 is a graph illustrating shielding effectiveness of the conductive layer 130 of FIG. 1A versus frequency. The curve S1 shows that the worst shielding effectiveness of the conductive layer 130 occurs at a first resonant frequency f1 when the recess 125 is not formed in the package body 140. The curve S2 shows that the worst shielding effectiveness of the conductive layer 130 shifts to a second resonant frequency f2 when the recess 125 is formed in the semiconductor package. Accordingly, through the design of the recess 125, the resonant frequency corresponding to the worst shielding effectiveness may be increased so that it exceeds the operating frequency of the chip 120, thus improving the shielding effectiveness of the conductive layer 130.

Figure 4:
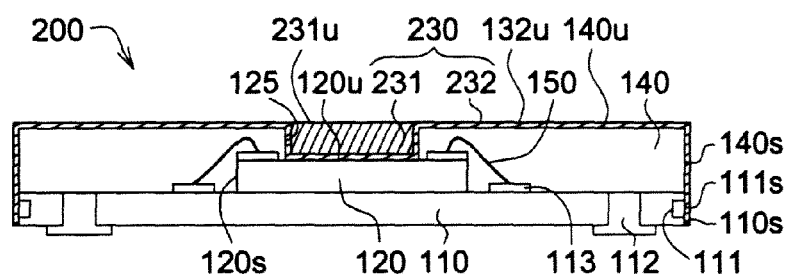
FIG. 4 is a cross-sectional side view of a semiconductor package according to another of the present embodiments.

Referring to FIG. 4, a cross-sectional view of a semiconductor package according to another of the present embodiments is illustrated. The semiconductor package 200 includes a substrate 110, a chip 120, a recess 125, a package body 140, a conductive layer 230 and a plurality of bond wires 150. The conductive layer 230 includes a filler 231 and a conformal shield 232. The filler 231 covers the portion of the conformal shield 232 located in the recess 125. The conformal shield 232 uniformly covers the outer surface of the package body 140, the outer lateral surface 111s exposed from the grounding element 111, and the upper surface 120u of the chip 120 exposed from the recess 125. More specifically, the conformal shield 232 directly contacts the upper surface 120u of the chip 120 exposed from the recess 125.

The filler 231 may be conductive or insulative, and may comprise, for example, a metal such as copper, or a high polymer. In addition, the filler 231 within the recess 125 may be used as a buffer layer for alleviating any concentration of stress caused by deformation of the package body 140. The filler 231 completely fills the recess 125, such that the upper surface 231u of the filler 231 is substantially coplanar with the upper surface 232u of the conformal shield 232. In an alternative embodiment, the upper surface 231u of the filler 231 may protrude from the upper surface 232u of the conformal shield 232. In an alternative embodiment, the filler 231 may fill only a portion of the recess 125 such that the upper surface 231u of the filler 231 is recessed below the upper surface 232u of the conformal shield 232.

In the embodiment of FIG. 4, thermal dissipation is improved by disposing the conformal shield 232 directly on the upper surface 120u of the chip 120 through the recess 125. The design of the recess 125 may be such that the frequency corresponding to the worst shielding effect is increased and the shielding effect is thereby enhanced.

Figure 5:
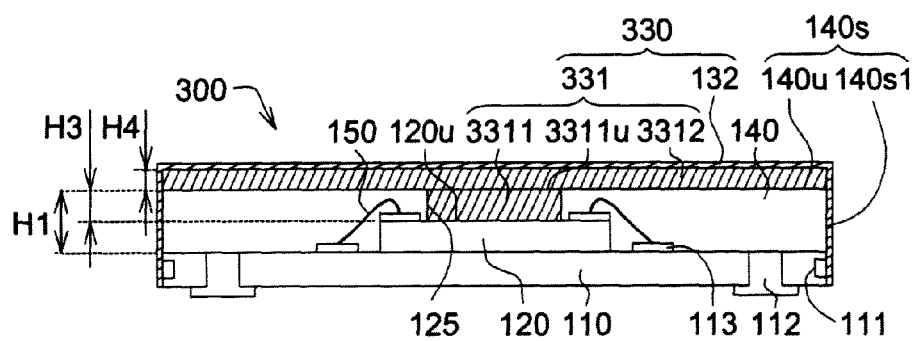
FIG. 5 is a cross-sectional side view of a semiconductor package according to another of the present embodiments.

Referring to FIG. 5, a cross-sectional view of a semiconductor package according to another of the present embodiments is illustrated. The semiconductor package 300 includes a substrate 110, a chip 120, a recess 125, a package body 140, a conductive layer 330, and a plurality of bond wires 150. An outer surface of the package body 140 includes an upper surface 140u and an outer lateral surface 140s. The conductive layer 330 includes a conductive material 331 and a conformal shield 132. The conductive material 331 covers the upper surface 120u of the chip 120 and the upper surface 140u of the package body 140, and fills the recess 125. The conformal shield 132 covers the upper surface 331u of the conductive material 331, the outer lateral surface 140s of the package body 140, and the grounding element 111.

As illustrated in FIG. 5, the conductive material 331 includes a first conductive connecting element 3311 and a second conductive connecting element 3312. The first conductive connecting element 3311 fills the recess 125, and the second conductive connecting element 3312 covers the upper surface 3311u of the first conductive connecting element 3311 and the upper surface 140u of the package body 140. The first conductive connecting element 3311 and the second conductive connecting element 3312 may be similar to the conductive connecting element 131 discussed above.

Figure 6:
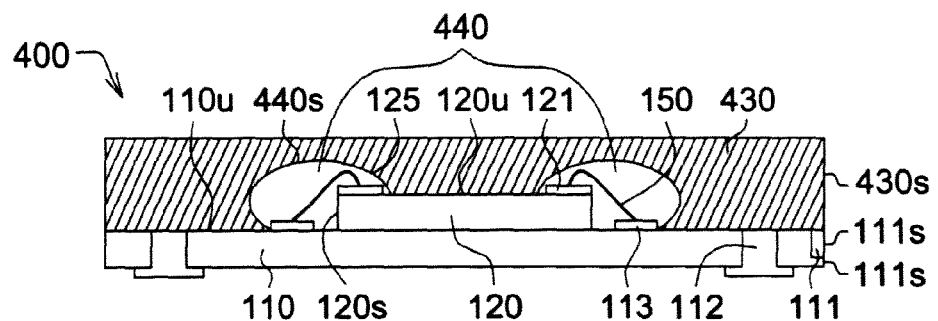
FIG. 6 is a cross-sectional side view of a semiconductor package according to another of the present embodiments.

Referring to FIG. 6, a cross-sectional view of a semiconductor package according to another of the present embodiments is illustrated. The semiconductor package 400 includes a substrate 110, a chip 120, a recess 125, a package body 440, a conductive layer 430 and a plurality of bond wires 150. The conductive layer 430 covers the upper surface 120u of the chip 120, the outer lateral surface 440s of the package body 440, and a portion of the upper surface 110u of the substrate 110. The conductive layer 430 has an outer lateral surface 430s that is substantially coplanar with the outer lateral surface 110s of the substrate 110. The conductive layer 430 covers the upper surface of the grounding element 111 exposed from the upper surface 110u of the substrate 110, and the conductive layer 430 can thus be electrically connected to a ground voltage. Alternatively, the conductive layer 430 may cover a via pad, which is electrically connected to a ground voltage via the through hole 112 and not covered by the package body 440.

The package body 440 is formed at the edge of the semiconductor chip 120 and encapsulates the bond wires 150, the pads 121 of the chip 120 portions of the upper surface 110u of the substrate 110 not covered by the conductive layer 430, and the pads 113 of the substrate 110. The package body 440 is thus disposed to prevent the conductive layer 430 from electrically contacting the bond wires 150 or the pads 113, 121. Consequently, the package body 440 may include a number of sub-package bodies disposed in a separate manner, wherein each sub-package body encapsulates its corresponding bond wires 150 and pads 113, 121. The outer surface 440s of the package body 440 is a curved surface in the illustrated embodiment. For example, the cross-sectional view of the package body 440 may be an ellipse or a circle or any other shape, including non-curved shapes.

Figure 7:
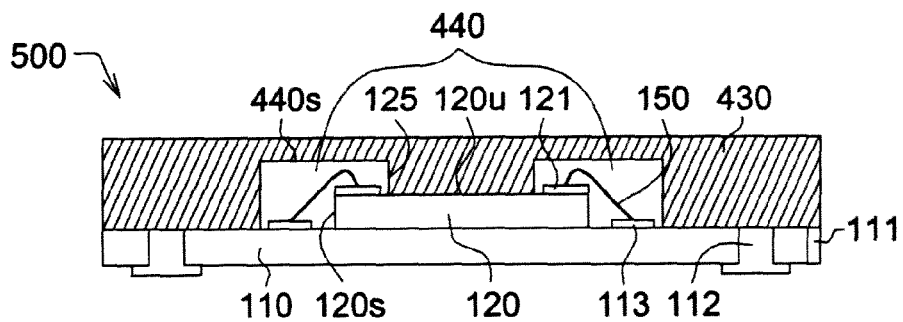
FIG. 7 is a cross-sectional side view of a semiconductor package according to another of the present embodiments.

Referring to FIG. 7, a cross-sectional view of a semiconductor package according to another of the present embodiments is illustrated. The semiconductor package 500 includes a substrate 110, a chip 120, a recess 125, a package body 440, a conductive layer 430 and a plurality of bond wires 150. The embodiment of FIG. 7 is similar to that of FIG. 6, except that the outer surface 440s of the package body 440 is planar. For example, the cross-sectional silhouette of the package body 440 may be a rectangle or a polygon. The structure of the package body depends on the desired resonance frequency, and preferably avoids short circuiting between the conductive layer and the semiconductor chip.

Figure 8:
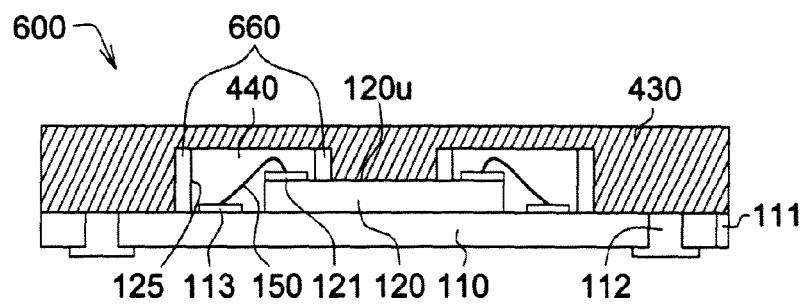
FIG. 8 is a cross-sectional side view of a semiconductor package according to another of the present embodiments.

Referring to FIG. 8, a cross-sectional view of a semiconductor package according to another of the present embodiments is illustrated. The semiconductor package 600 includes a substrate 110, a chip 120, a package body 440, a conductive layer 430, a plurality of bond wires 150 and a dam 660. The dam 660 surrounds the bond wires 150, the pads 121 of the semiconductor chip 120, and the pads 113 of the substrate 110. The package body 440 fills spaces defined by the dam 660 and further encapsulates the bond wires 150. Through the design of the dam 660, the shape of the package body 440 can be effectively controlled to prevent the conductive layer 430 from electrically contacting the bond wires 150 and the pads 113, 121. Alternatively, the dam 660 may include a plurality of separate sub-dams for defining the recess 125, wherein each sub-package body filling the recess 125 encapsulates its corresponding bond wires 150 and pads 113, 121.

The dam 660 may be a frame formed on the chip 120 through surface adhesive technology (SMT) or coating technology. In addition, the dam 660 may be conductive or insulative, such as a metal or a material similar to that of the conductive layer 430.

Figure 9A:
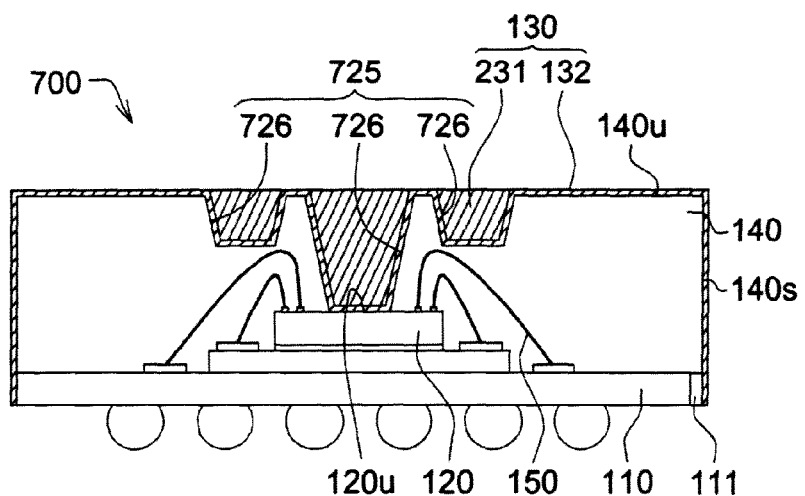
FIG. 9A is a cross-sectional side view of a semiconductor package according to another of the present embodiments.

Referring to FIG. 9A, a cross-sectional view of a semiconductor package according to another of the present embodiments is illustrated. The semiconductor package 700 includes a substrate 110, a chip 120, a package body 140, a conductive layer 130 and a plurality of bond wires 150. The conductive layer 130 includes a filler 231 and a conformal shield 132. The filler 231 occupies and fills a recess 725 in the conformal shield 132. The conformal shield 132 uniformly covers the outer surface of the package body 140, the grounding element 111, and the upper surface 120u of the chip 120.

As illustrated in FIG. 9A, the recess 725 may be a patterned recess, and includes a plurality of sub-recesses 726. At least one of the sub-recesses 726 is spaced from an upper surface 120u of the chip 120, and at least one of the sub-recesses 726 contacts the upper surface 120u of the chip 120. In alternative embodiments, all sub-recesses 726 may contact the upper surface 120u of the chip 120.

Figure 9B:
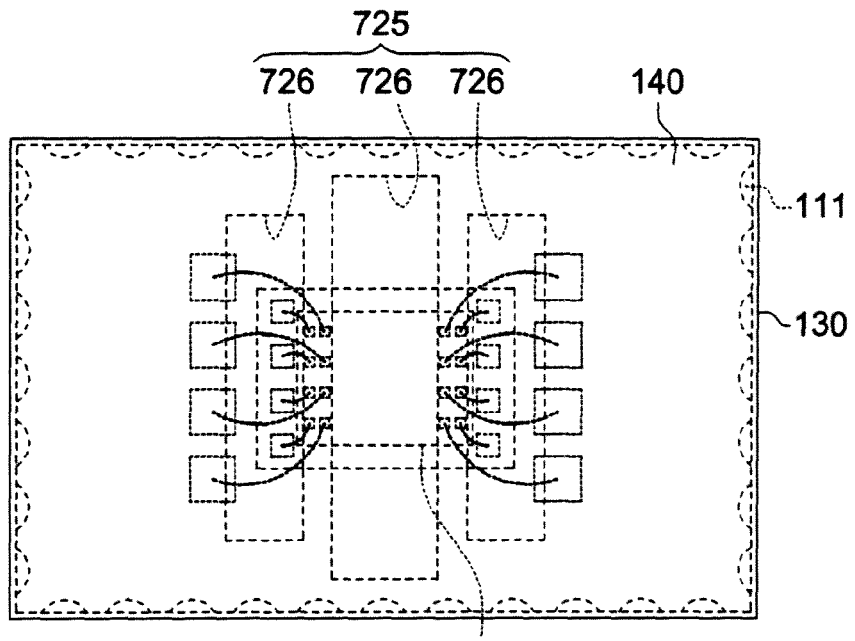
FIG. 9B is a top plan view of the semiconductor package of FIG. 9A.

FIG. 9B illustrates a top plan view of the semiconductor package 700 of FIG. 9A. Each sub-recess 726 appears as a rectangular strip, with a central one of the sub-recesses 726 having a longer length than the other two sub-recesses 726, which are of equal lengths. While not illustrated, in alternative embodiments, the recesses 725 may be arranged as an open or closed ring such as a circle, an ellipse, a polygon or a curved shape.

Figure 9C:
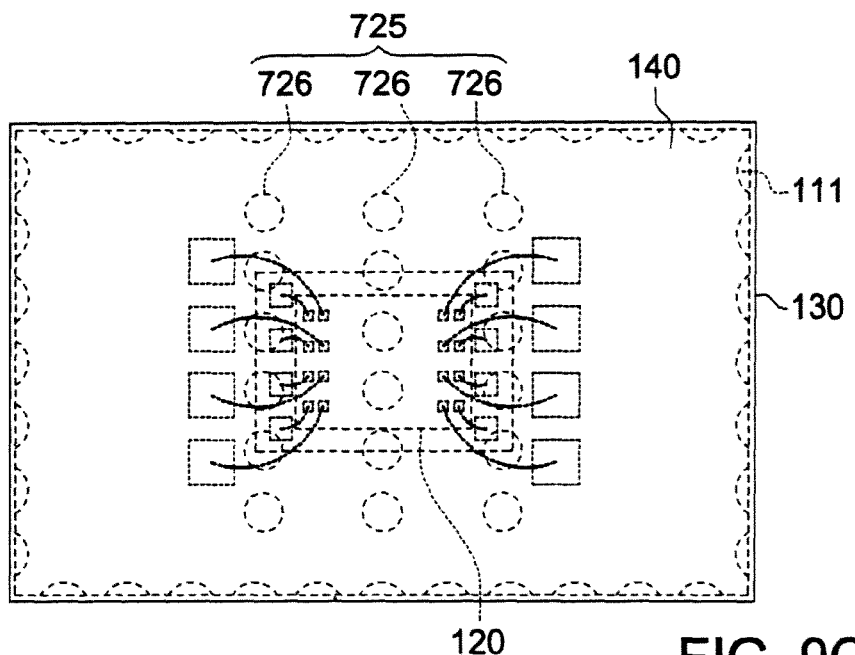
FIG. 9C is a top plan view of an alternative design of the semiconductor package of FIG. 9A.

FIG. 9C illustrates an alternative embodiment of a top plan view of the semiconductor package 700 of FIG. 9A. In the illustrated embodiment, the shape of each sub-recess 726, as viewed from above, is a circle. In alternative embodiments, the cross-sectional shape of each sub-recess 726 may be a polygon and/or a curved shape, wherein the polygon is a rectangle or any other shape, and the curved shape is an ellipse or any other curved shape.

Figure 10:
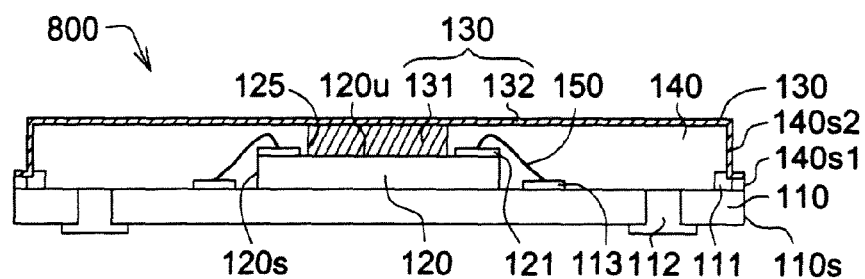
FIG. 10 is a top plan view of a semiconductor package according to another of the present embodiments.

Referring to FIG. 10, a cross-sectional view of a semiconductor package according to another of the present embodiments is illustrated. The semiconductor package 800 includes a substrate 110, a chip 120, a recess 125, a package body 140, a conductive layer 130 and a plurality of bond wires 150. The package body 140 has a first outer lateral surface 140s1 and a second outer lateral surface 140s2 that are parallel to one another, but not coplanar. The outer lateral surface 110s of the substrate 110 is coplanar with the first outer lateral surface 140s1. Such a structure may be formed by the "half-cut" method, and all of the present embodiments may similarly include a structure similar to the half-cut structure of FIG. 10.

Figure 11:
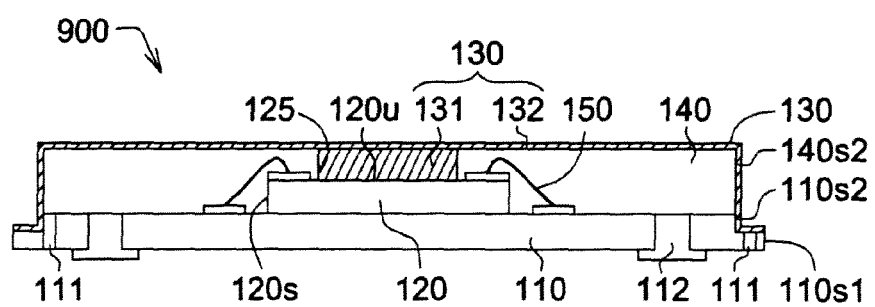
FIG. 11 is a top plan view of a semiconductor package according to another of the present embodiments.

Referring to FIG. 11, a cross-sectional view of a semiconductor package according to another of the present embodiments is illustrated. The semiconductor package 900 includes a substrate 110, a chip 120, a recess 125, a package body 140, a conductive layer 130 and a plurality of bond wires 150. The substrate 110 has a first outer lateral surface 110s1 and a second outer lateral surface 110s2 that are parallel to one another, but not coplanar. The second outer lateral surface 110s2 of the substrate 110 is coplanar with the outer lateral surface 140s of the package body 1402. Such a structure may be formed by the "half-cut" method, and all of the present embodiments may similarly include a structure similar to the half-cut structure of FIG. 10.

Figure 12A:
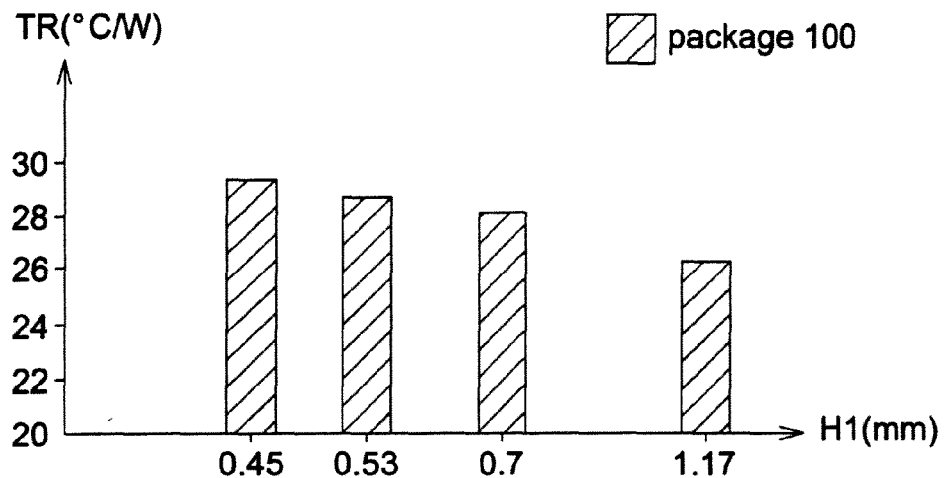
FIG. 12A is a graph illustrating experimental results of thickness of a package body and thermal resistance according to one of the present embodiments.

Referring to FIG. 12A, simulation values of the thermal resistance (TR) of the semiconductor package 100 of FIG. 1 are illustrated. The size of semiconductor package 100 in this example is 10×10 millimeters, and the size of the chip 120 is 5×5 X 0.1 millimeters. The thickness H1 of the package body 140 ranges between 0.45 and 1.17 millimeters. The thickness H2 of the conductive connecting element 131 of the semiconductor package 100 ranges between about 0.325 and 1.045 millimeters. Accordingly, the thickness of the conductive layer 130 and the package body 140 determines the TR.

Figure 12B:
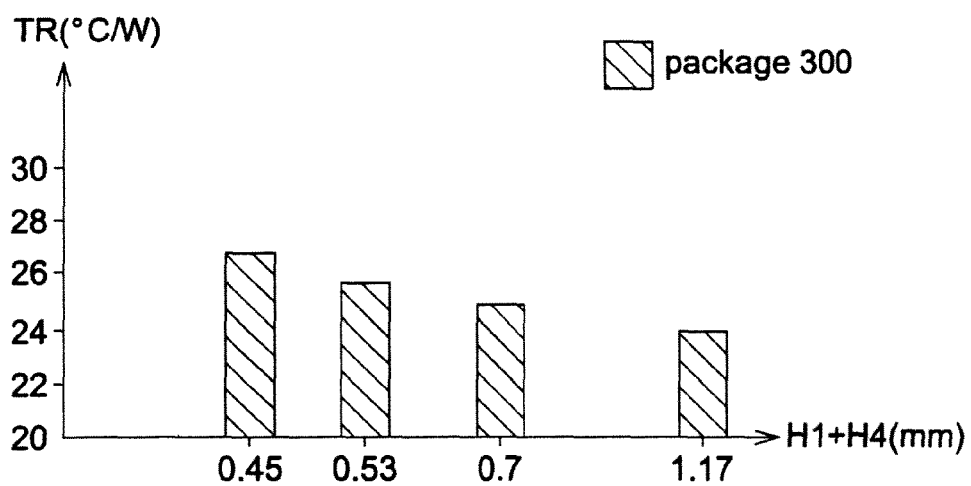
FIG. 12B is a graph illustrating experimental results of thickness of a package body and thermal resistance according to another of the present embodiments.

Referring to FIG. 12B, simulation values of the TR corresponding to the semiconductor package 300 of FIG. 5 are illustrated. The size of semiconductor package 300 in this example is 10×10 millimeters and the size of the chip 120 is 5×5×0.1 millimeters. The thickness of the package body 140 and the second material 3312 ranges between 0.45 and 1.17 millimeters. Considering the bond wires 150, the thickness H3 of the first conductive connecting element 3311 of the semiconductor package 300 is about 0.1 millimeters, and the thickness H4 of the second conductive connecting element 3312 ranges between 0.225 and 0.945 millimeters. Accordingly, the thickness of the first conductive connecting element 3311, the second conductive connecting element 3312, and the package body 140 determines the TR.

The semiconductor package 300 has lower TR than the semiconductor package 100, since the thickness and area of the conductive layer 330 of the semiconductor package 300 are greater than those of the conductive layer 130 of the semiconductor package 100. Thus, in comparison to the semiconductor package 100, the semiconductor package 300 has better thermal conductivity (the lower the TR, the better the thermal conductivity). With reference to FIG. 12A, when the thickness of the package body 140 is about 1.17 millimeters, the semiconductor package 100 has the greatest performance in thermal conductivity. With reference to FIG. 12B, when the thickness of the package body 140 and the second conductive connecting element 3312 is about 1.17 millimeters, the semiconductor package 300 has the greatest performance in thermal conductivity.

Figure 13A:
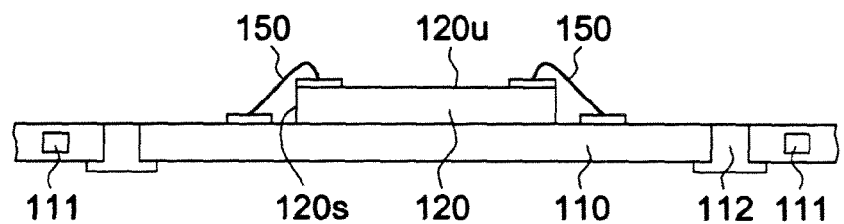
FIGS. 13A-13F are cross-sectional side views of steps in a process of making the semiconductor package of FIG. 1A.

FIGS. 13A-13F illustrate steps in a method of making the semiconductor package 100 of FIG. 1A. Referring to FIG. 13A, the semiconductor chip 120 is secured to the substrate 110, such as with an adhesive. The chip 120 has a lateral surface 120s and an upper surface 120u, and the substrate 110 includes at least one grounding element 111. The bond wires 150 connect the chip 120 to the substrate 110.

Figure 13B:
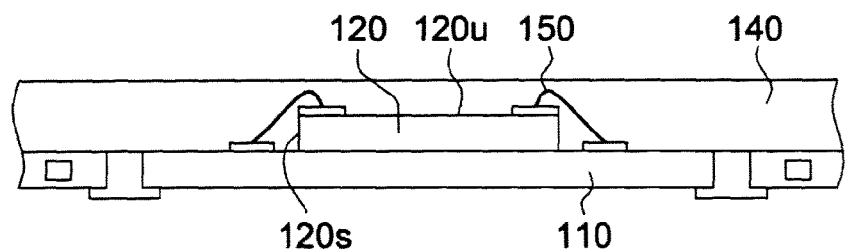
Figure 13C:
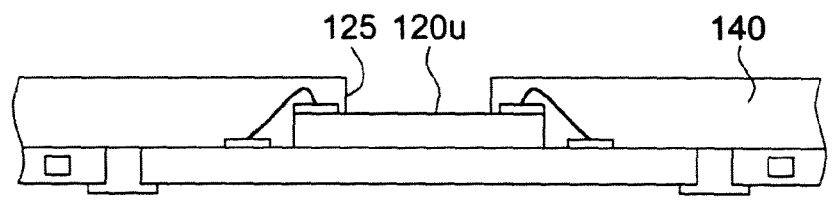

As illustrated in FIG. 13B, the package body 140 encapsulates the chip 120 and the bond wires 150. The package body 140 may be formed by compression molding, injection molding, transfer molding, or any other process. As illustrated in FIG. 13C, the recess 125 is formed in the package body 140 and partially exposes the upper surface 120u of the chip 120. The recess 125 may be formed by patterning technology, for example, or by any other process. The patterning technology may be, for example, photolithography, chemical etching, laser drilling, mechanical drilling, grinding, etc.

Figure 13D:
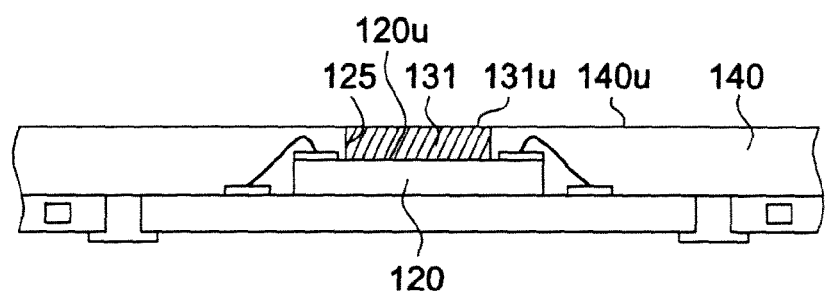

As illustrated in FIG. 13D, the conductive connecting element 131 is added to fill the recess 125 and cover the exposed upper surface 120u of the chip 120. The conductive connecting element 131 may be formed by dispensing or coating, for example, or by any other process. In some embodiments, the conductive connecting element 131 and the conformal shield 132 may be formed in the same process subsequent to singulation, which is described below with respect to FIG. 13E. In the illustrated embodiment, the upper surface 131u of the conductive connecting element 131 and the upper surface 140u of the package body 140 are coplanar.

Figure 13E:
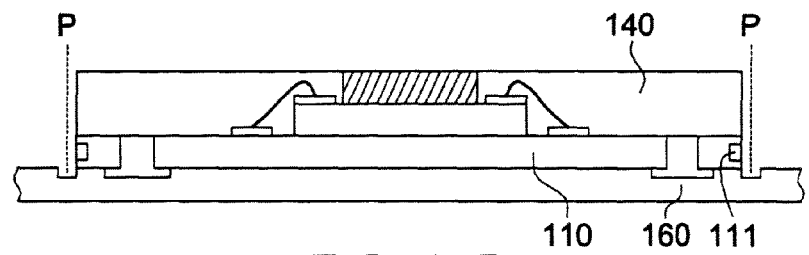

As illustrated in FIG. 13E, after the substrate 110 is disposed on a carrier 160, the package is singulated on either side at paths P passing through the package body 140, the substrate 110 and the grounding element 111. The singulation exposes the grounding element 111, and may be performed with a laser, a blade, or by any other means. In the illustrated embodiment, the singulation paths P cut the package body 140 and the substrate 110 according to the "full-cut" method. However, the singulation method of the present embodiments is not limited to the illustrated example.

Figure 13F:
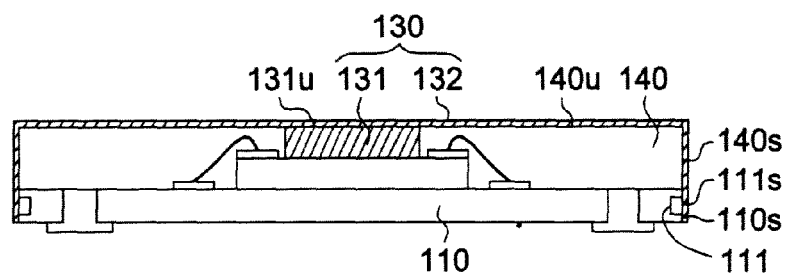

As illustrated in FIG. 13F, the conformal shield 132 is formed over the outer surfaces of the package body 140, the upper surface 131u of the conductive connecting element 131, the exposed outer lateral surfaces 111s of the grounding portions 111, and the outer lateral surfaces 110s of the substrate 110. Together with the conductive connecting element 131, the conformal shield 132 forms the conductive layer 130. The method of forming the conformal shield 132 may comprise, for example, chemical vapor deposition, electroless plating, electrolytic plating, printing, spinning, spraying, sputtering, vacuum deposition, or any other method.

Figure 14:
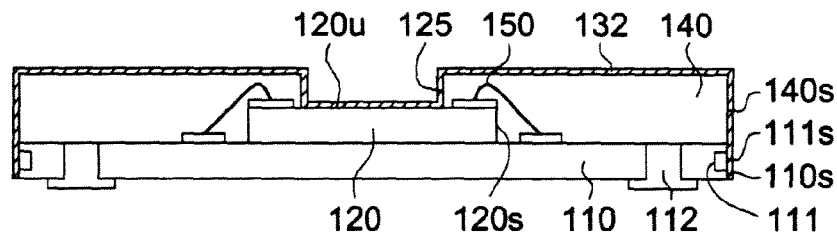
FIG. 14 is a cross-sectional side view of a step in a process of making the semiconductor package of FIG. 4.

Referring to FIG. 14, a step in a process of making the semiconductor package 200 of FIG. 4 is illustrated. After singulation, the conformal shield 132 is formed to uniformly cover the outer surfaces of the package body 140, the exposed outer lateral surfaces 111s of the grounding portion 111, and the outer lateral surfaces 110s of the substrate 110. The conformal shield 132 may be formed by any of the processes discussed above with respect to FIG. 13F. While not shown, the filler 231 of the semiconductor package 200 is formed in the recess 125 to covering the portion of the conformal shield 132 in the recess 125. The filler 231 may partially or completely fill the recess 125.

Figure 15A:
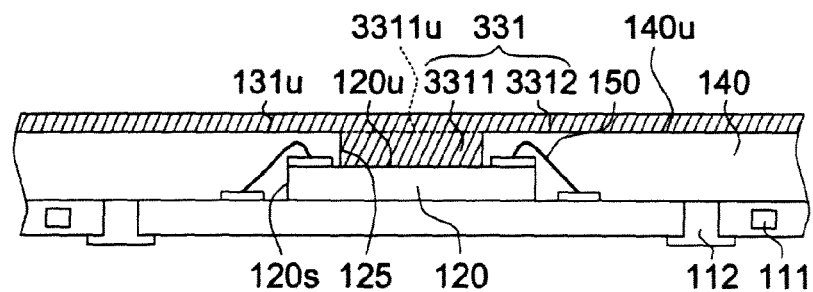
FIGS. 15A-15C are cross-sectional side views of steps in a process of making the semiconductor package of FIG. 5.
Figure 15B:
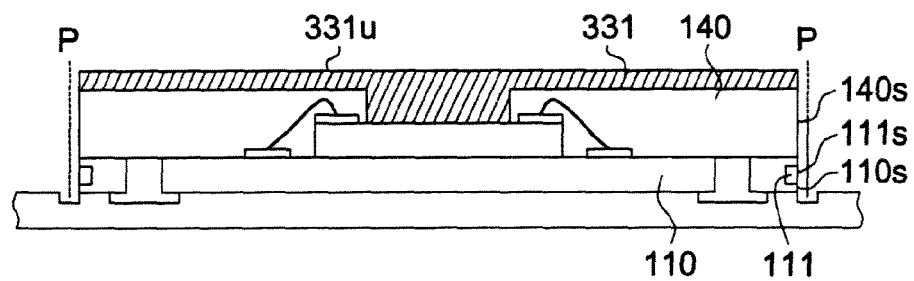
Figure 15C:
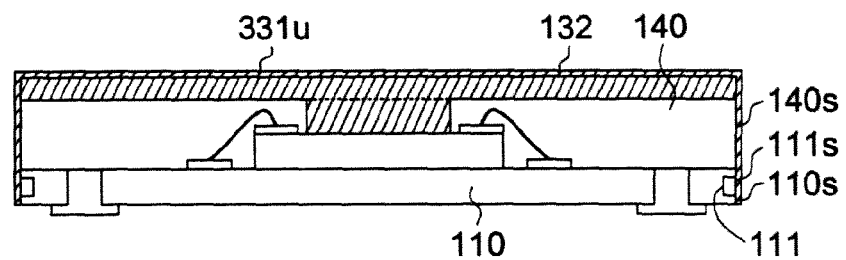

Referring to FIGS. 15A-15C, a process of making the semiconductor package 300 of FIG. 5 are illustrated. As illustrated in FIG. 15A, before singulation, the conductive material 331 is formed to cover the upper surface 120u of the chip 120 and the upper surface 140u of the package body 140, and to fill in the recess 125. The conductive material 331 may be formed by any of the methods discussed above with respect to FIGS. 13D and 13F. The conductive material 331 includes a first conductive connecting element 3311 within the recess 125 and a second conductive connecting element 3312 covering the upper surface 3311u of the first conductive connecting element 3311 and the upper surface 140u of the package body 140. The package body 140 may be formed by any of the methods discussed above with respect to FIG. 13B.

As illustrated in FIG. 15B, the package is singulated on either side at paths P passing through the conductive material 331, the package body 140, the substrate 110 and the grounding element 111. The singulation exposes the grounding element 111, and may be performed by any of the methods discussed above with respect to FIG. 13F.

As illustrated in FIG. 15C, the conformal shield 132 is formed to cover the upper surface 331u of the conductive material 331, the outer lateral surfaces 140s of the package body 140, the exposed outer lateral surfaces 111s of the grounding element 111, and the outer lateral surfaces 110s of the substrate 110. The conformal shield 132 may be formed by any of the processes discussed above with respect to FIG. 13F.

Figure 16A:
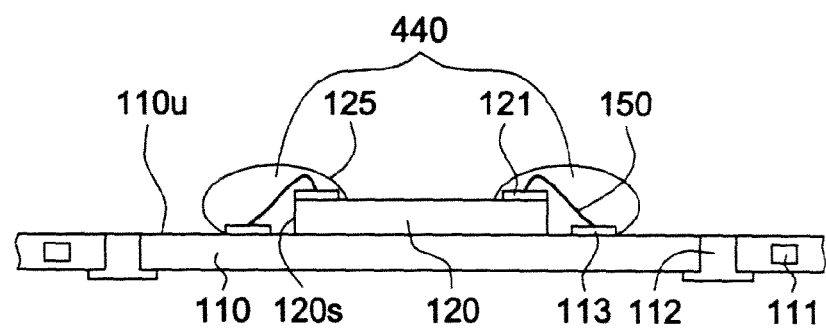
FIGS. 16A-16B are cross-sectional side views of steps in a process of making the semiconductor package of FIG. 6.
Figure 16B:
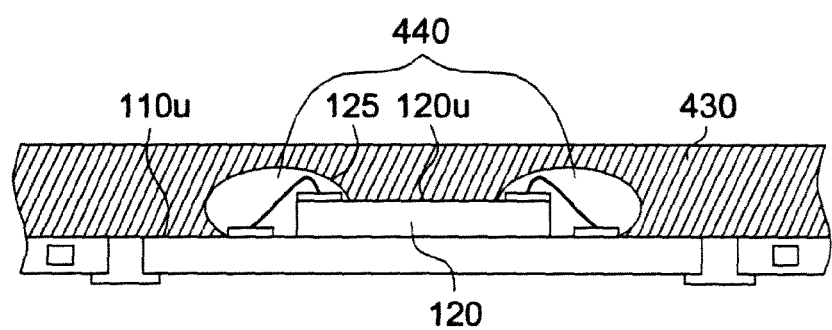

Referring to FIG. 16A-16B, a process of making the semiconductor package 400 of FIG. 6 is illustrated. With reference to FIG. 16A, the package body 440 is formed to encapsulate the lateral surfaces 120s of the chip 120, the bond wires 150, and the pads 113, 121. The package body 440 may be formed by any of the methods discussed above with respect to FIG. 13B. The package body 440 covers only portions of the upper surfaces 110u, 120u of the substrate 110 and the chip 120, respectively, to prevent electrical contact between the bond wires 150 and the pads 113, 121 and the subsequently formed conductive layer 430. In the illustrated embodiment, the package body 440 is in the shape of a ring (viewed from above) and defines the recess 125. With reference to FIG. 16B, the conductive layer 430 is formed to encapsulate the chip 120 and the package body 440. The conductive layer 430 covers those portions of the upper surfaces 110u, 120u of the substrate 110 and the chip 120, respectively, not covered by the package body 440. The conductive layer 430 may be formed by any of the processes discussed above with respect to FIG. 13F.

Figure 17A:
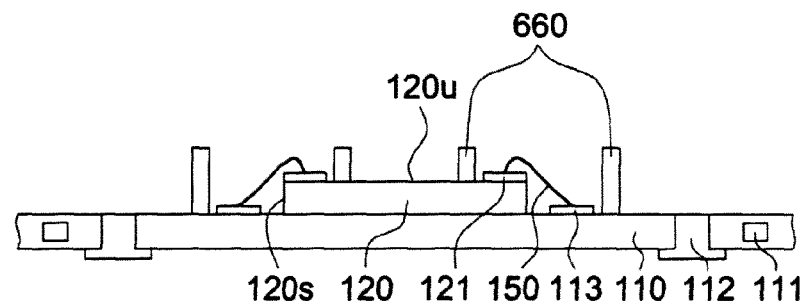
FIGS. 17A-17B are cross-sectional side views of steps in a process of making the semiconductor package of FIG. 8.
Figure 17B:
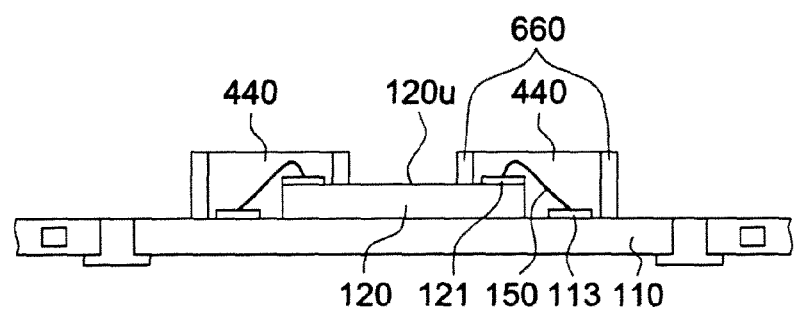

Referring to FIGS. 17A-17B, a process of making the semiconductor package 600 of FIG. 8 is illustrated. As illustrated in FIG. 17A, at least one dam 660 is formed surrounding the bond wires 150 and the pads 113, 121. The dam 660 may be formed by surface adhesive technology (SMT), coating, or any other method. The dam 660 defines the boundaries of the subsequently formed package body 440. As illustrated in FIG. 17B, a package body 440 is formed to fill in the area defined by the dam 660 and encapsulate the bond wires 150 and the pads 113, 121. The package body 440 prevents electrical contact between the bond wires 150 and the pads 113, 121 and the subsequently formed conductive layer 430 (FIG. 8).

Figure 18A:
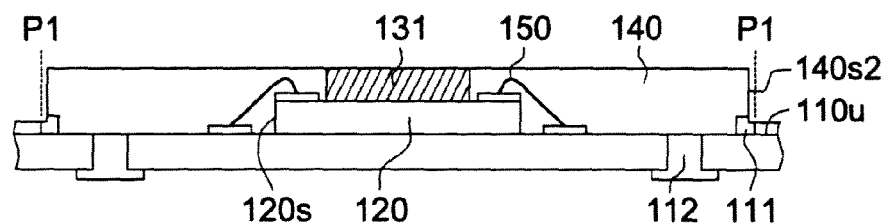
FIGS. 18A-18C are cross-sectional side views of steps in a process of making the semiconductor package of FIG. 10.
Figure 18B:
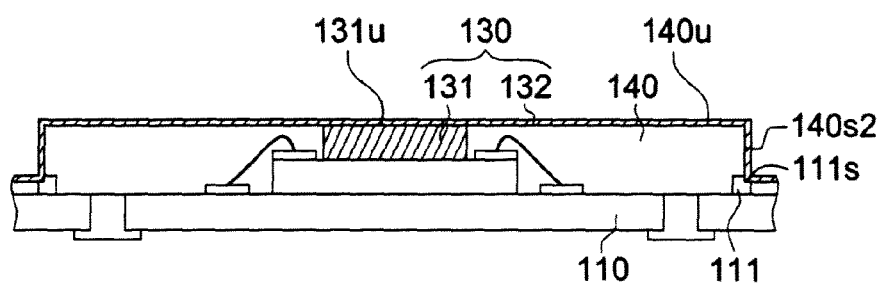
Figure 18C:
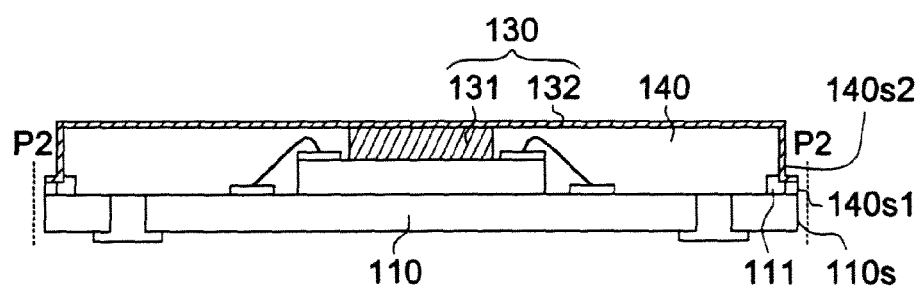

Referring to FIGS. 18A-18C, a process of making the semiconductor package 800 of FIG. 10 is illustrated. As illustrated in FIG. 18A, the package is singulated on either side at paths P1 passing through the package body 140. The singulation may be performed by any of the methods discussed above with respect to FIG. 13F. After the singulation path P1 is formed, the package body 140 forms a second outer lateral surface 140s2, and the grounding element 111 is partially exposed from the second outer lateral surface 140s2. In the illustrated embodiment, the grounding element 111 protrudes over the upper surface 110u of the substrate 110. Therefore the singulation path P1 may cut the grounding element 111 without passing through the entire package body 140. This singulation method is referred as the "half-cut" method. However, in alternative embodiments, the singulation path P1 may pass through the entire package body 140. In other embodiments, when the grounding element 111 is embedded in the substrate 110, the singulation path P1 passes through the entire package body 140 and a portion of the substrate 110 to expose the grounding element 111 disposed within the substrate 110.

As illustrated in FIG. 18B, a conformal shield 132 is formed to cover the outer surfaces of the package body 140, the upper surface 131u of the conductive connecting element 131, and the exposed outer lateral surfaces 111s of the grounding element 111. Together with the conductive connecting element 131, the conformal shield 132 forms the conductive layer 130.

As illustrated in FIG. 18C, the package is singulated on either side at paths P2 passing through the package body 140 and the substrate 110. The singulation may be performed by any of the methods discussed above with respect to FIG. 13F. After singulation, the package body 140 forms a first outer lateral surface 140s1, and the substrate 110 forms an outer lateral surface 110s, wherein the first outer lateral surface 140s1 is substantially coplanar with the outer lateral surface 110s. Since the singulation paths P1 and P2 are formed separately, the first outer lateral surface 140s1 of the package body 140 is parallel to, but not coplanar with, the second outer lateral surface 140s2.

In the present embodiments, the conductive layers, such as the conductive layer 130 in FIG. 1A, provide both a ground path and a heat conducting path away from the chip 120. Heat and electrical current flow from the chip 120 through the conductive connecting element 131 on the upper surface 120u of the chip 120 to the conformal shield 132. The heat is dissipated outward through the conformal shield 132, while the electrical current flows to the grounding element 111. The conformal shield 132 thus provides both heat dissipation and grounding in addition to EMI shielding. In other embodiments the flow path is slightly different. For example, in the embodiment of FIG. 4 the heat and electrical current flow first through the conformal shield 232 contacting the upper surface 120u of the chip 120 and then through the filler 231 in the recess 125.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to making processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
    a substrate having a grounding element;
    a semiconductor chip disposed on the substrate, the semiconductor chip having a plurality of bond pads;
    a package body encapsulating the semiconductor chip;
    a recess in the package body that exposes at least a portion of an upper surface of the semiconductor chip;
    a conductive connecting element disposed in the recess between at least two of the bond pads, wherein the conductive connecting element extends beyond a lateral edge of the semiconductor chip; and
    a conductive layer disposed over an outer surface of the package body, wherein the conductive layer directly contacts the conductive connecting element and the grounding element;
    wherein a combination of the conductive element and the conductive layer provides thermal dissipation and electromagnetic interference (EMI) shielding for the semiconductor package.

2. The semiconductor package of claim 1, wherein the conductive connecting element directly contacts the upper surface of the semiconductor chip.

3. The semiconductor package of claim 2, wherein a thermal path away from the semiconductor chip extends directly from the chip to the conductive connecting element and directly from the conductive connecting element to the conductive layer.

4. The semiconductor package of claim 1, wherein the recess increases a resonant frequency of the package corresponding to a worst EMI shielding effectiveness so that the resonant frequency exceeds an operating frequency of the semiconductor chip.

5. The semiconductor package of claim 1, wherein the conductive layer directly contacts the upper surface of the semiconductor chip.

6. The semiconductor package of claim 1, wherein the recess comprises a plurality of sub-recesses that are spaced from the upper surface of the semiconductor chip.

7. The semiconductor package of claim 1, wherein the grounding element does not extend all the way through the substrate.

8. The semiconductor package of claim 2, wherein the grounding element comprises a partial via having a sidewall that is exposed from the substrate.

9. A semiconductor package, comprising:
    a substrate having a grounding element, wherein the grounding element comprises a partial via having a sidewall that is exposed from the substrate;
    a semiconductor chip disposed on the substrate, the semiconductor chip having a plurality of bond pads;
    a package body encapsulating the semiconductor chip;
    a recess in the package body that exposes at least a portion of the upper surface of the semiconductor chip;
    means coupled to the upper surfaces of the semiconductor chip and the package body for providing thermal dissipation and electromagnetic interference (EMI) shielding for the semiconductor package.

10. The semiconductor package of claim 9, wherein the means comprises a recess in the package body above the semiconductor chip, a conductive connecting element disposed within the recess, and a conformal shield over the conductive connecting element.

11. The semiconductor package of claim 10, wherein a thermal path away from the semiconductor chip extends directly from the chip to the conductive connecting element and directly from the conductive connecting element to the conductive layer.

12. The semiconductor package of claim 10, wherein the recess increases a resonant frequency of the package corresponding to a worst EMI shielding effectiveness so that the resonant frequency exceeds an operating frequency of the semiconductor chip.

13. The semiconductor package of claim 9, wherein the means comprises a conformal shield covering the outer surface of the package body and the upper surface of the semiconductor chip exposed by the recess, and a filler within the recess with the conformal shield disposed between the filler and the upper surface of the semiconductor chip.

14. The semiconductor package of claim 13, wherein a thermal path away from the semiconductor chip extends directly from the chip to the conductive connecting element and directly from the conductive connecting element to the conductive layer.

15. The semiconductor package of claim 13, wherein the recess increases a resonant frequency of the package corresponding to a worst EMI shielding effectiveness so that the resonant frequency exceeds an operating frequency of the semiconductor chip.

16. The semiconductor package of claim 9, wherein the means comprises a conductive connecting element covering the upper surface of the semiconductor chip and an upper surface of the package body, and a conformal shield covering the conductive connecting element and the package body.

17. A method of making a semiconductor package, the method comprising:
    disposing a semiconductor chip on a substrate, wherein the semiconductor chip has a lateral surface and an upper surface, and the substrate comprises a grounding element;

forming a package body encapsulating the lateral surface of the semiconductor chip, wherein the package body defines a recess exposing the upper surface of the semiconductor chip;

singulating the package body, the substrate, and the grounding element to expose a sidewall of the grounding element; and forming a conductive layer covering an outer surface of the package body and the upper surface of the semiconductor chip exposed by the recess, and contacting the exposed grounding element.

18. The method of claim 17, wherein the step of forming the conductive layer comprises:

forming a conductive connecting element covering the upper surface of the semiconductor chip; and forming a conformal shield covering the outer surface of the package body, an upper surface of the conductive connecting element, and contacting the exposed grounding element.

19. The method of claim 17, wherein the step of forming the conductive layer comprises:

forming a conformal shield covering the outer surface of the package body and the upper surface of the semiconductor chip exposed by the recess, and contacting the grounding element; and forming a filler within the recess.

* * * * *